United States Patent [19]
Kamiya

[11] Patent Number: 5,576,634
[45] Date of Patent: Nov. 19, 1996

[54] BUS DRIVER FOR HIGH-SPEED DATA TRANSMISSION WITH WAVEFORM ADJUSTING MEANS

[75] Inventor: Hiroshi Kamiya, Tokyo, Japan

[73] Assignee: NEC Corporation, Tokyo, Japan

[21] Appl. No.: 544,581

[22] Filed: Oct. 18, 1995

[30] Foreign Application Priority Data

Oct. 31, 1994 [JP] Japan ................................. 6-267013

[51] Int. Cl.⁶ ............................................. H03K 19/0175
[52] U.S. Cl. ............................. 326/26; 326/82; 327/335; 327/381
[58] Field of Search ................................. 326/21, 82, 88, 326/26, 27, 86, 87; 327/335, 380, 381

[56] References Cited

U.S. PATENT DOCUMENTS

| | | | |
|---|---|---|---|
| 4,532,439 | 7/1985 | Koike | 326/87 |
| 4,779,013 | 10/1988 | Tanaka | 326/87 |
| 5,204,558 | 4/1993 | Kumaki et al. | 326/87 |
| 5,483,188 | 1/1996 | Frodsham | 327/380 |
| 5,493,232 | 2/1996 | Kube | 326/27 |

FOREIGN PATENT DOCUMENTS 58-78221   5/1983   Japan .

Primary Examiner—Edward P. Westin
Assistant Examiner—Benjamin D. Driscoll
Attorney, Agent, or Firm—Whitham, Curtis, Whitham & McGinn

[57] ABSTRACT

A bus driver includes differentiating and delay circuits connected together in parallel. The differentiating circuit receives an input signal via a first buffer circuit and produces a first signal having a falling and rising period. The delay circuit delays the input signal to produce a second signal output via a second buffer circuit. The second signal is delayed so that the second signal begins falling after the first signal starts falling and so that second signal begins rising after the first signal starts rising. The first and second signals are combined to produce an output signal. The preceding edge of the output signal is rounded because the relatively short falling of the first signal precedes the relatively long falling of the second signal. The following edge of the output signal is rounded because the short rising of the first signal suppresses an end portion of the long falling of the second signal. The waveform of the output signal is adjustable by changing parameters such as, for example, the delay time of the delay circuit, the capacitance of the capacitor and the power of the first and second buffer circuits.

15 Claims, 8 Drawing Sheets

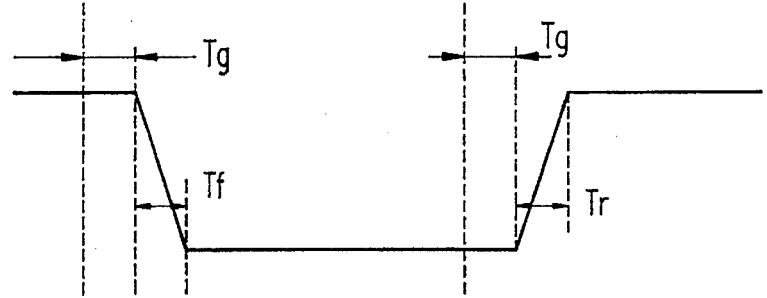
FIG.2A
FIG.2B
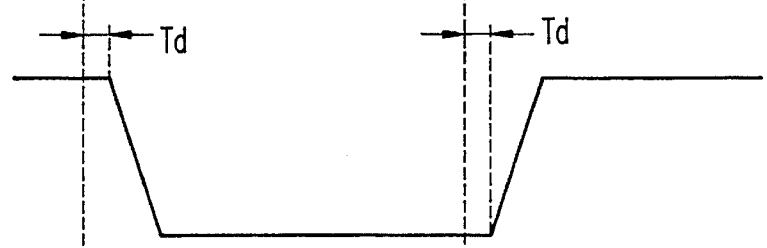
FIG.2C
FIG.2D
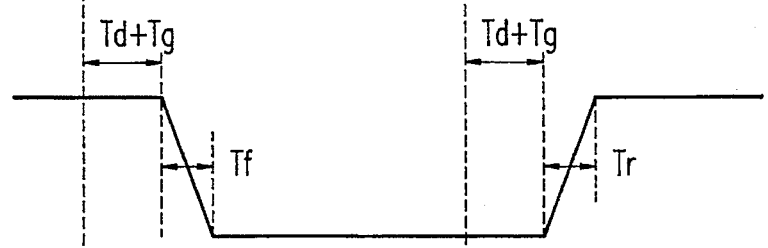
FIG.2E
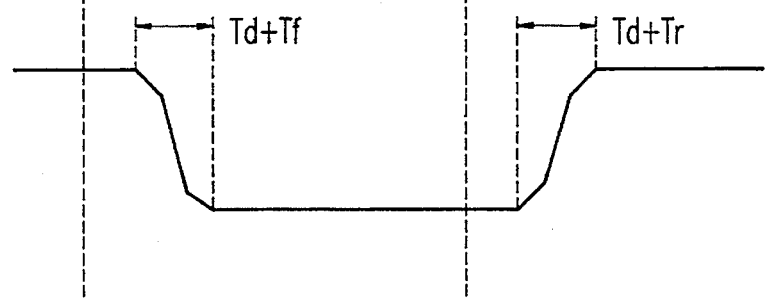
FIG.2F

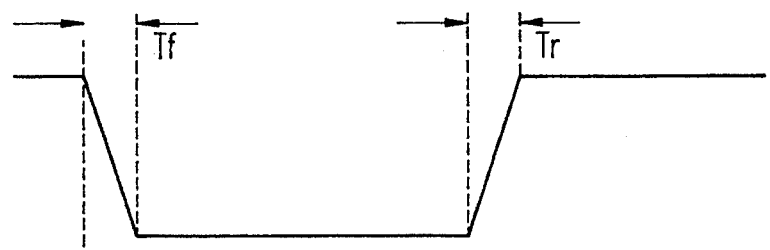
FIG.6A
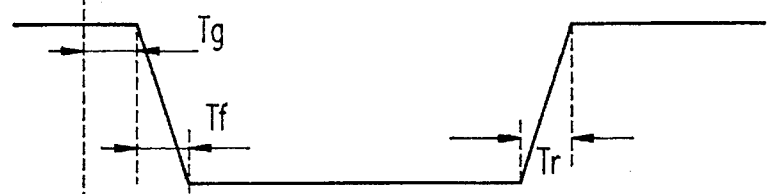
FIG.6B
FIG.6C
FIG.6D
FIG.6E
FIG.6F
FIG.6G
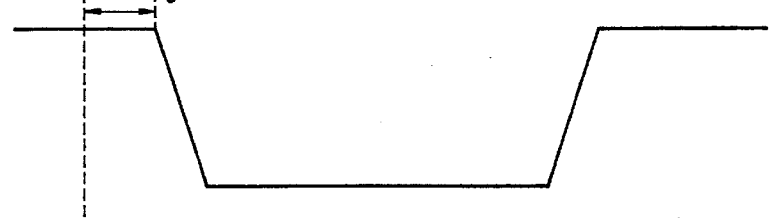
FIG.6H
FIG.6I

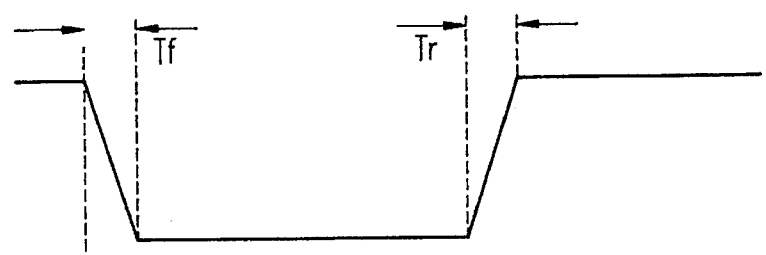
FIG.8A
FIG.8B
FIG.8C
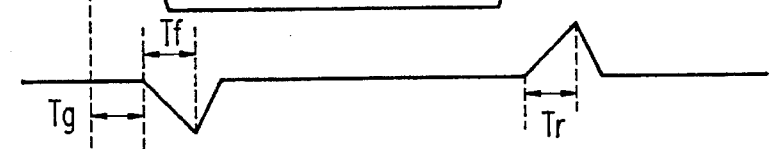
FIG.8D
FIG.8E
FIG.8F
FIG.8G
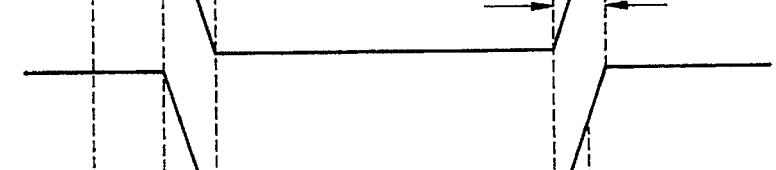
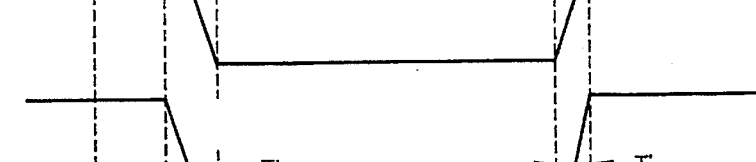
FIG.8H
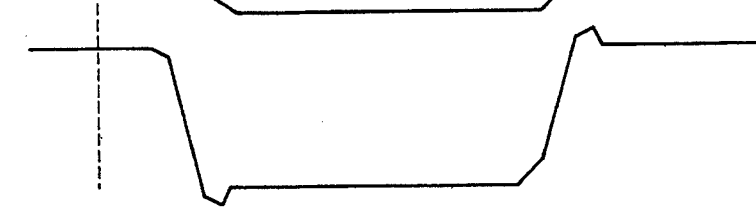
FIG.8I

BUS DRIVER FOR HIGH-SPEED DATA TRANSMISSION WITH WAVEFORM ADJUSTING MEANS

BACKGROUND OF THE INVENTION

The present invention relates to a bus driver, and more particularly to a bus driver for a high-speed data transmission.

In an information processing apparatus (e.g., a computer), data is transmitted between a plurality of logic blocks (i.e., large-scale-integrated circuit (LSI) chips) through a bus circuit, which comprises a bus, a bus driver and a bus receiver.

The bus driver sends the signal to the bus by controlling a voltage of the bus to a high level or to a low level. The bus receiver reproduces the signal by detecting the voltage of the bus.

High-speed data transmission requires a powerful bus driver that can feed a large current to the bus in a short period of time. The power of the bus driver can be improved, for example, by driving a bus line with a plurality of bus drivers.

The improvement of the bus driver's power results in an increased though-rate, which is an important factor of high-speed data transmission. However, as the through-rate is increased, an unacceptable deformation appears in the signals through the bus.

The main factor of this deformation is the reflection signal from the end of the bus. The reflection signal is an attenuating wave caused by the resistance and capacitance existing in the bus. The bus driver cannot send the next signal until the reflection signal attenuates enough so as not to disturb the next signal. The attenuation of the reflection signal takes a considerable period of time. Therefore, a high-power bus driver itself cannot improve the throughput sufficiently.

SUMMARY OF THE INVENTION

In view of the aforementioned problems of the conventional bus drivers, one object of the present invention is to adjust the waveform of the signal to be sent to the bus so that the waveform becomes suitable for high-speed data transmission. The adjustment of the waveform may be performed when the waveform is different from what was expected by the designer due to production errors.

Another object of the present invention is to provide a device for adjusting the waveform without consuming a large amount of electrical power.

According to the present invention, the edge of a signal is shaped to suppress the noise such as the reflection signal. Specifically, the rising and falling edges are rounded.

This shaping is performed by incorporating a differentiating circuit and a delay circuit. The differentiating circuit produces a first signal having a first period (e.g., a falling period) and a second period (e.g., rising period) subsequent to the first period.

The delay circuit produces a second signal by delaying the signal such that the signal begins moving from a first level (e.g., falling from an initial high level) after the first signal begins moving (e.g., falling) during the first period and the signal reaches a second level (e.g., a low level) after the first signal begins moving (e.g., rising) during the second period.

Thereafter, the first and second signals are combined to produce an output signal having a rounded edge. The preceding portion of the edge is rounded because a small level change due to the first signal appears prior to a large level change due to the second signal. The following portion of the edge is rounded because a small level change due to the first signal suppresses a portion of the large level change.

According to the present invention, a bus driver has input and output terminals. The bus driver includes a first buffer circuit, a differentiating circuit, a delay circuit, and a second buffer circuit.

The first buffer circuit has input and output terminals. The input terminal of the first buffer circuit is connected to the input terminal of the bus driver.

The differentiating circuit has input and output terminals. The input and output terminals of the differentiating circuit are connected to the output terminal of the first buffer circuit and the output terminal of the bus driver, respectively.

The delay circuit has input and output terminals. The input terminal of the delay circuit is connected to the input terminal of the bus driver.

The second buffer circuit has input and output terminals. The input and output terminals of the second buffer circuit are connected to the output terminal of the delay circuit and the output terminal of the bus driver, respectively.

The differentiating circuit may include a capacitor and a resistor. The resistor may be a resistance inherently existing in the bus or a separate, discrete resistor circuit.

The waveform of an output signal of the bus driver may be adjustable to change at least one parameter of the parts of the bus driver. Such a parameter include the delay time of the delay circuit, the capacitance of the capacitor and the power of the first and second buffer circuits.

BRIEF DESCRIPTION OF THE DRAWINGS

Other objects, features and advantages of the present invention will become more apparent when the following description is read in conjunction with the accompanying drawings, wherein:

FIGS. 2(a) to 2(f) show waveforms of signals produced in the first embodiment.

FIGS. 6(a) to 6(i) show waveforms of signals produced in the third embodiment.

FIGS. 8(a) to 8(i) show waveforms of signals produced in the fourth embodiment.

In these drawings, the same reference numerals depict the same parts, respectively.

DETAILED DESCRIPTION OF THE PREFERRED EMBODIMENTS

Next is described a first embodiment of the present invention.

Figure 1:
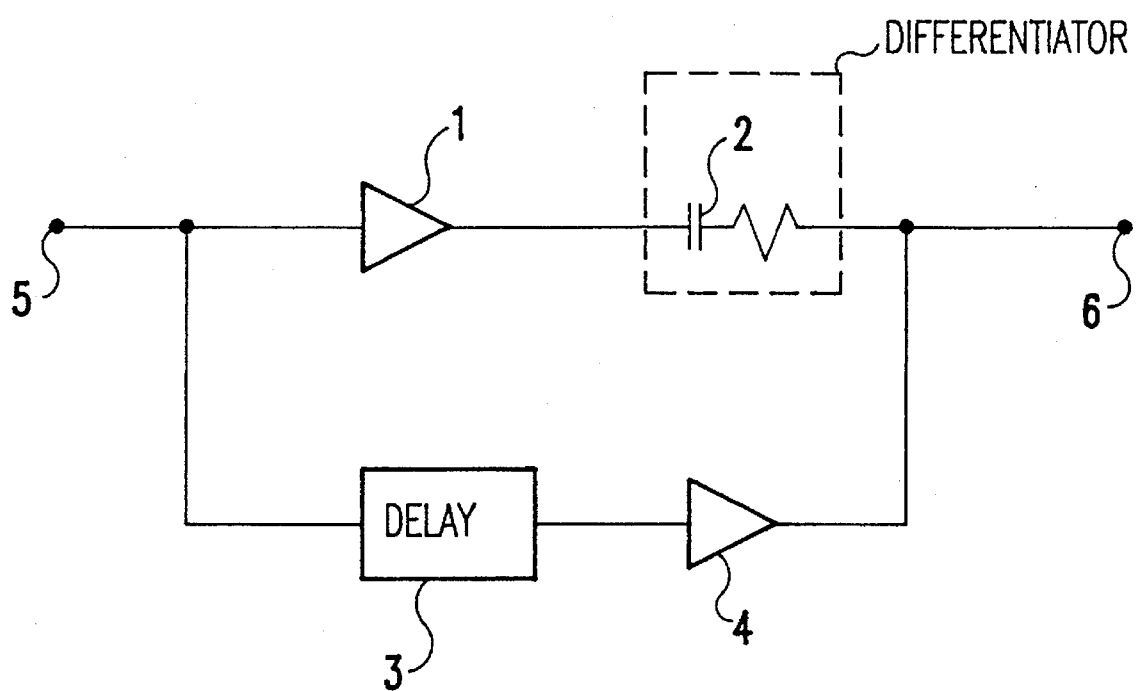
FIG. 1 is a circuit diagram of a bus driver according to a first embodiment of the present invention.

Referring to FIG. 1, a bus driver according to the first embodiment of the present invention has an input terminal 5 and an output terminal 6. The input terminal 5 receives a signal from an electronic device (e.g., an LSI chip). The output terminal 6 is connected to a bus.

The bus driver includes a first buffer circuit 1, a capacitor 2, a delay circuit 3 and a second buffer circuit 4.

The input terminal of the first buffer circuit 1 is connected to the input terminal 5 of the bus driver. First and second terminals of the capacitor are connected to the output terminal of the first buffer 1 and the output terminal 6 of the bus driver, respectively.

The input terminal of the delay circuit 3 is connected to the input terminal 5 of the bus driver. The input and output terminals of the second buffer circuit 4 are connected to the output terminal of the delay circuit 3 and the output terminal 6 of the bus driver, respectively.

Along with the resistance (shown as a resistor unreferenced in FIG. 1) inherently existing in the bus or connection lines, the capacitor 2 forms a differentiating circuit (as shown in FIG. 1 by the broken lines).

The buffer circuits 1 and 4 may be tri-state circuits or open collector circuits. The capacitor may be a metal oxide semiconductor (MOS) capacitance or a pn capacitance, which are used in a memory cell. A circuit (e.g., a NAND gate) having transistor-transistor logic (TTL) is suitable for the delay circuit 3 in view of the delay time. Other circuits which can be used as the delay circuit 3 include a gate of metal oxide semiconductor field-effect transistor (MOSFET), an ordinary buffer circuit or a MOS inventer.

Next is described the operation of the first embodiment referring to an exemplary operation. In this exemplary operation, the buffer circuits 1 and 4 have the same delay time "Tg". The delay time of the delay circuit 3 is "Td".

Referring to FIG. 2(a), the input signal at the input terminal 5 falls from a high level in the time "Tf" and rises from a low level in the time "Tr". This signal is supplied to the first buffer circuit 1 and the delay circuit 3.

Referring to FIG. 2(b), compared with the input signal, the output signal of the first buffer circuit 1 is delayed by the time interval Tg. This signal is supplied to one terminal of the capacitor 2.

Referring to FIG. 2(c), compared with the input signal, the output signal of the delay circuit 3 is delayed by the time interval Td.

Referring to FIG. 2(d), the output signal of the first buffer circuit 1 is differentiated through the capacitor 2. The waveform of the output signal of the capacitor 2 is rather complex depending on a plurality of factors such as the capacitance and resistance of the capacitor 2, the bus and the bus receiver.

In FIG. 2(d), the waveform is depicted as two triangular waves for simplicity. That is, when the input signal falls, the output signal of the capacitor 2 falls linearly for the time interval Tf and, thereafter, linearly rises to the original level. When the input signal rises, the output signal of the capacitor 2 rises linearly for the time interval Tr and, thereafter, falls to the original level.

Referring to FIG. 2(e), compared with the output signal of the delay circuit 3 depicted in FIG. 2(c), the output signal of the second buffer circuit 4 is delayed by the time interval Tg. That is, the output signal of the buffer circuit 4 is delayed by the combined time interval of Td+Tg.

Referring to FIG. 2(f), at the output terminal 6 of the bus driver, the output signals of the capacitor 2 and the second buffer circuit 4 are combined to produce a waveform having rounded rising and falling edges.

The rounded edges are produced by the following process.

When the signal falls, at first, a small voltage drop appears due to the falling output signal of the capacitor 2. Thereafter, a large voltage drop appears due to the falling output signal of the second buffer circuit 4. Finally, the rate of the voltage dropping is decreased due to the rising output signal of the capacitor 2. Thus, the falling edge of the input signal is rounded. The rising edge of the input signal is rounded in the same way as the falling edge.

The rounded rising and falling edges prevent the noise induced by the sudden voltage changes (i.e., increased through-rate of the signal) because the through-rate of the signal is substantially decreased at the edges.

During the operation, the first buffer circuit 1 does not consume much power because the current through the capacitor 2 is small.

The capacitance of the capacitor 2 and the delay time of the delay circuit 3 can be selectively adjusted by the designer, such that the waveform of the output signal of the bus driver is suitably shaped to reduce the noise effectively.

In the aforementioned exemplary operation, the falling time Tf and the rising time Tr of the input signal is assumed to be the same before and after the input signal go through the first or second buffer circuit 1 or 3. However, the present invention is not limited to this assumption.

Next is described the second embodiment of the present invention. The object of the second embodiment is to make the bus driver selectively adjustable such that the adjustment compensates for production errors. Specifically, in the second embodiment, the delay time of the delay circuit 3 is made selectively adjustable.

Figure 3:
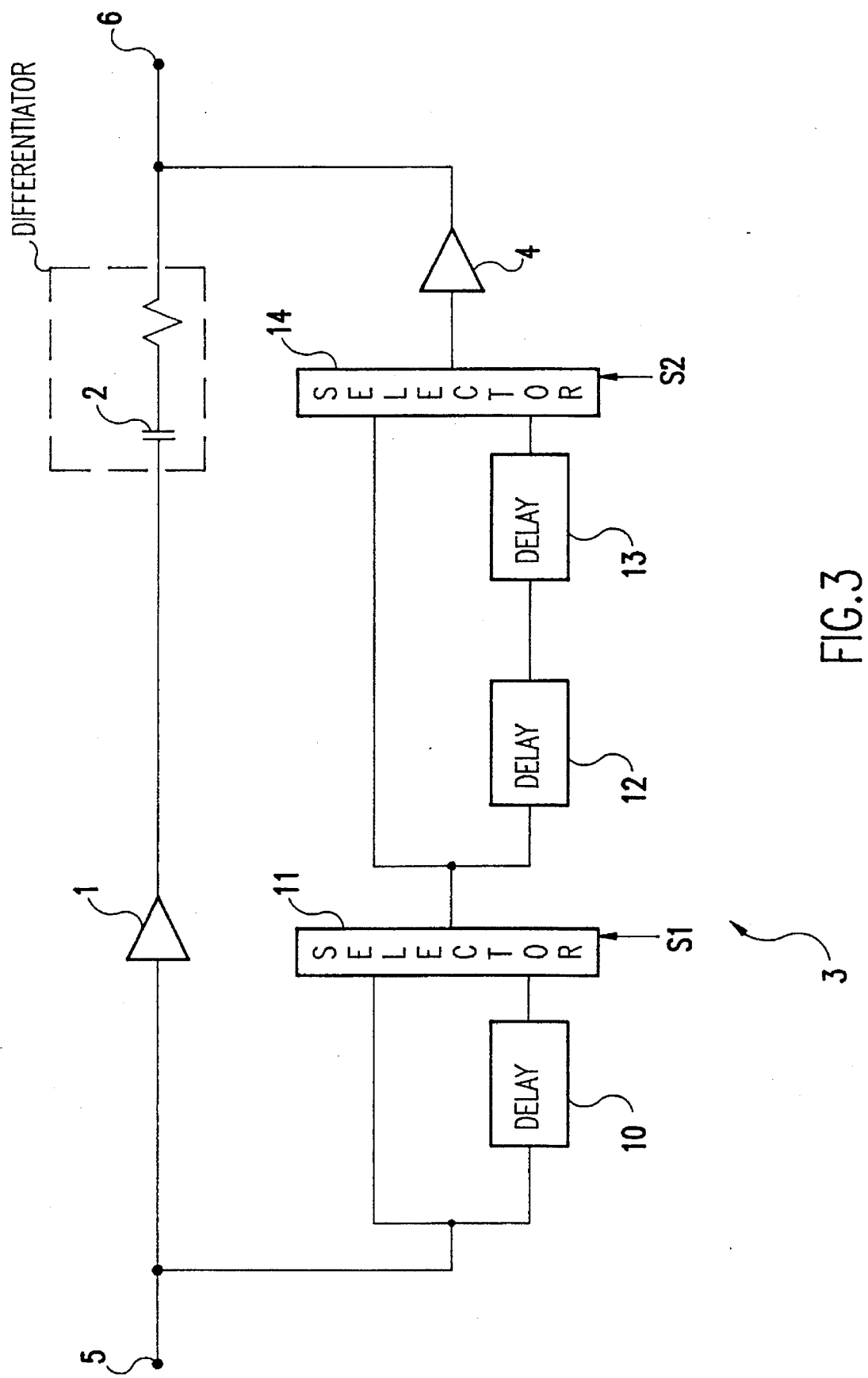
FIG. 3 is a circuit diagram of a bus driver according to a second embodiment of the present invention.

Referring to FIG. 3, in the second embodiment, the delay circuit 3 includes first and second blocks.

The first block includes a delay circuit 10 and a selector 11. The input terminal of the delay circuit 10 is connected to the input terminal 5 of the bus driver. The selector 11 receives the input signal through the input terminal 5 and the output signal of the delay circuit 10. The selector 11 selectively outputs one of these signals according to a selection signal S1. In this exemplary embodiment, the selector 11 outputs the input signal through the input terminal 5 when the selection signal S1 is in the "H" state. When the selection signal S1 is in the "L" state, the selector 11 outputs the output signal of the delay circuit 10. The selector circuit 11 can be formed of suitable electronic components known in the art.

Obviously, the logic states may be reversed from that described above, according to the designer's requirements.

The second block includes delay circuits 12 and 13 and a selector 14. The delay circuits 12 and 13 are connected in series. The selector 14 outputs the output signal of the selector 11 when a selection signal S2 is in the "H" state. When the selection signal S2 is in the "L" state, the selector 14 selects the output signal of the delay circuit 13.

In this exemplary embodiment, the delay circuits 10, 12 and 13 each have the same delay time of Td. The delay time of the delay circuit 3 is selectively adjustable in the range of 0 to 3Td by the unit of Td according to the states of the selection signals S1 and S2.

Hereinafter, "the selection signal S is in the state of XY" means that the selection signals S1 and S2 are in the states of X and Y, respectively (X="H" or "L", Y="H" or "L").

Next is described the operation of the second embodiment referring to an exemplary operation. In this exemplary operation, the first and second buffer circuits 1 and 4 have the delay time of Tp and Tg, respectively. The delay circuits 10, 12 and 13 have the same delay time of Td.

Figure 4:
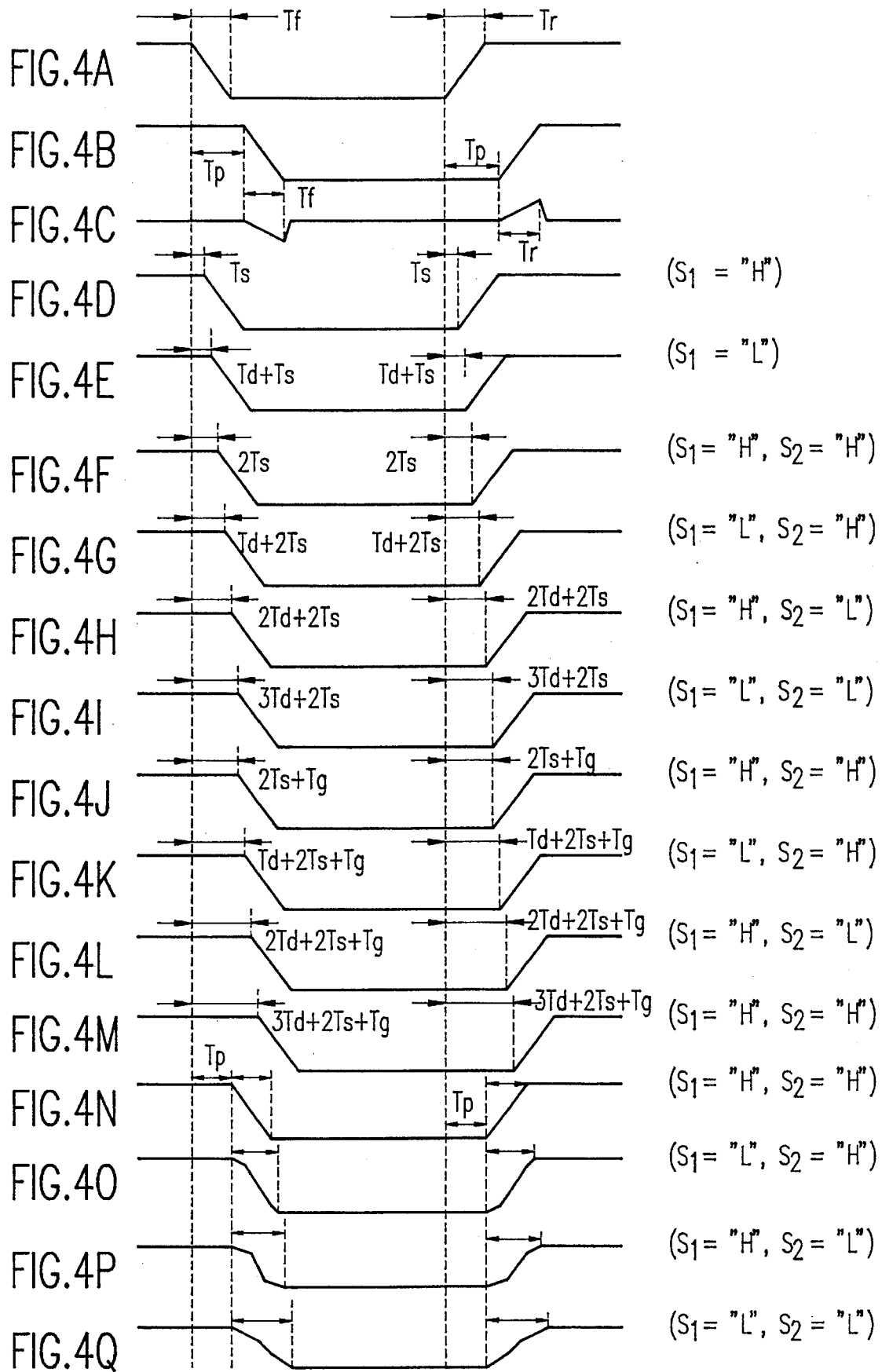
FIGS. 4(a) to 4(q) show waveforms of signals produced in the second embodiment.

Referring to FIG. 4(a), the input terminal 5 receives the same signal as one depicted in FIG. 2(a). Receiving this input signal, the first buffer circuit 1 and the capacitor 2 output the signals depicted in FIGS. 4(b) and 4(c), respectively, as in the first embodiment.

Referring to FIGS. 4(d) and 4(e), when the selection signal S1 is in the "H" or the "L" state, the selector 11 outputs a signal having a delay of Ts or Ts+Td, respectively.

Referring to FIGS. 4(f) to 4(i), when the selection signal S is in the state of "HH", "LH", "HL" or "LL", the selector 14 outputs a signal having a delay of 2Ts, Td+2Ts, 2Td+2Ts or 3Td+2Ts, respectively.

Referring to FIGS. 4(j) to 4(m), when the selection signal S is in the state of "HH", "LH", "HL" or "LL", the selector 14 outputs a signal having a delay of 2Ts+Tg, Td+2Ts+Tg, 2Td +2Ts+Tg or 3Td+2Ts+Tg, respectively.

Referring to FIGS. 4(n) to 4(q), when the selection signal S is in the state of "HH", "LH", "HL" or "LL", the signals depicted in FIGS. 4(n) to 4(q) appear at the output signal 6 of the bus driver, respectively. As depicted in FIGS. 4(n) to 4(q), the curvature and the through-rate of the rising and falling edges of the output signal are selectively adjustable by suitably changing the states of the selection signals S1 and S2.

When the waveform of the output signal of the bus driver deviates from that which was intended by production errors or the like, the waveform can be selectively adjusted by suitably setting the selection signals S1 and S2 in appropriate states.

Next is described a third embodiment of the present invention. In the third embodiment, the capacitance of the capacitor 2 is made selectively adjustable such that the waveform of the output signal of the bus driver is selectively adjustable.

Figure 5:
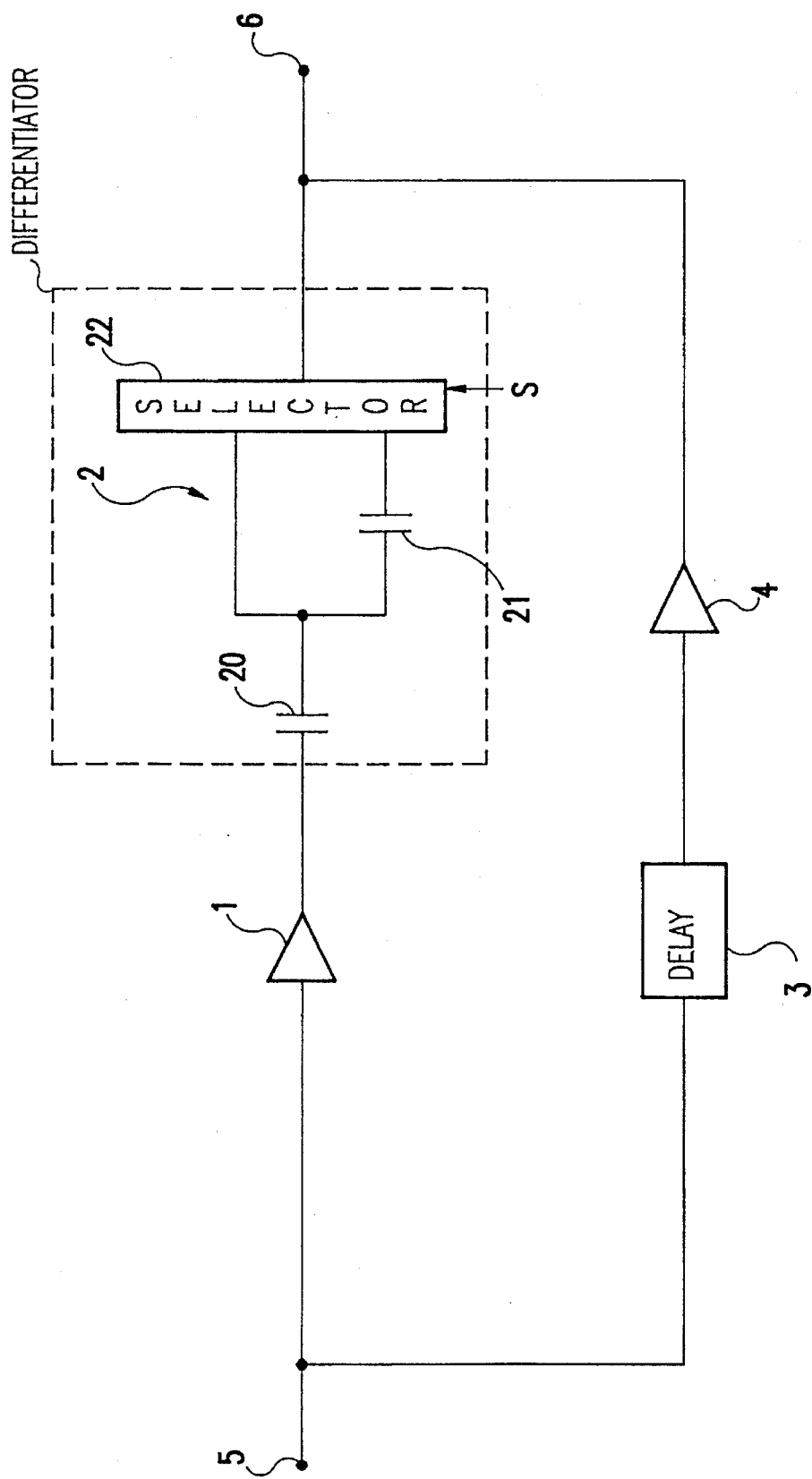
FIG. 5 is a circuit diagram of a bus driver according to a third embodiment of the present invention.

Referring to FIG. 5, in the third embodiment, the capacitor 2 includes a first capacitor 20, a second capacitor 21 and a selector 22.

One terminal of the capacitor 20 is connected to the output terminal of the first buffer circuit 1. Another terminal of the capacitor 20 is connected to one terminal of the second capacitor 21. The capacitors 20 and 21 are serially connected.

The selector 22 selects one of the signals from the capacitors 20 and 21 according to a selection signal S. Specifically, when the selection signal S is in the states of "H" and "L", the selector outputs the output signals of the capacitors 20 and 21, respectively. Thus, the capacitance of the capacitor 2 is made selectively adjustable. As in the previous embodiment, the selector 22 can be formed of suitable electronic components as known in the art.

Next is described the operation of the third embodiment referring to an exemplary operation. In this exemplary operation, the first and second buffer circuits 1 and 4 have the same delay time of Tg. The delay circuit 3 and the selector 22 have the delay time of Td and Ts, respectively.

Referring to FIG. 6(a), the input terminal 5 receives the same signal as depicted in FIG. 2(a). Receiving this input signal, the first buffer circuit 1 and the delay circuit 3 output the signals depicted in FIGS. 6(b) and 6(c) having delays of Tg and Td, respectively, as in the first embodiment.

Referring to FIG. 6(d), the capacitor 20 outputs the signal depicted in FIG. 6(d) as the capacitor 2 in the first embodiment.

Referring to FIGS. 6(e) and 6(f), when the selection signal S is in the "H" and "L" states, the selector 22 outputs signals depicted in FIGS. 6(e) and 6(f) from the capacitors 20 and 21, respectively. The signals depicted in FIGS. 6(e) and 6(f) have a delay of Tg+Ts.

The amplitude of the output signal of the capacitor 20 is greater than that of the capacitor 21 because the capacitor 20 alone has a greater capacitance than that of the serial connection of the capacitors 20 and 21.

Referring to FIG. 6(g), the second buffer circuit 4 outputs a signal depicted in FIG. 6(g) having a delay of Td+Tg.

Referring to FIGS. 6(h) and 6(i), when the selection signal S is set in the states of "H" and "L", the signals depicted in FIGS. 6(h) and 6(i) appear at the output terminal 6 of the bus driver, respectively. As depicted in FIGS. 6(h) and 6(i), the curvature of the rising and falling edges and the through-rate of the falling and rising slopes are selectively adjustable by changing the state of the selection signal S.

When the waveform of the output signal of the bus driver deviates from that which was intended by production errors or the like, the waveform can be selectively adjusted by setting the selection signal S.

Next is described a fourth embodiment of the present invention. In the fourth embodiment, the power of the second buffer 4 is made selectively adjustable.

Figure 7:
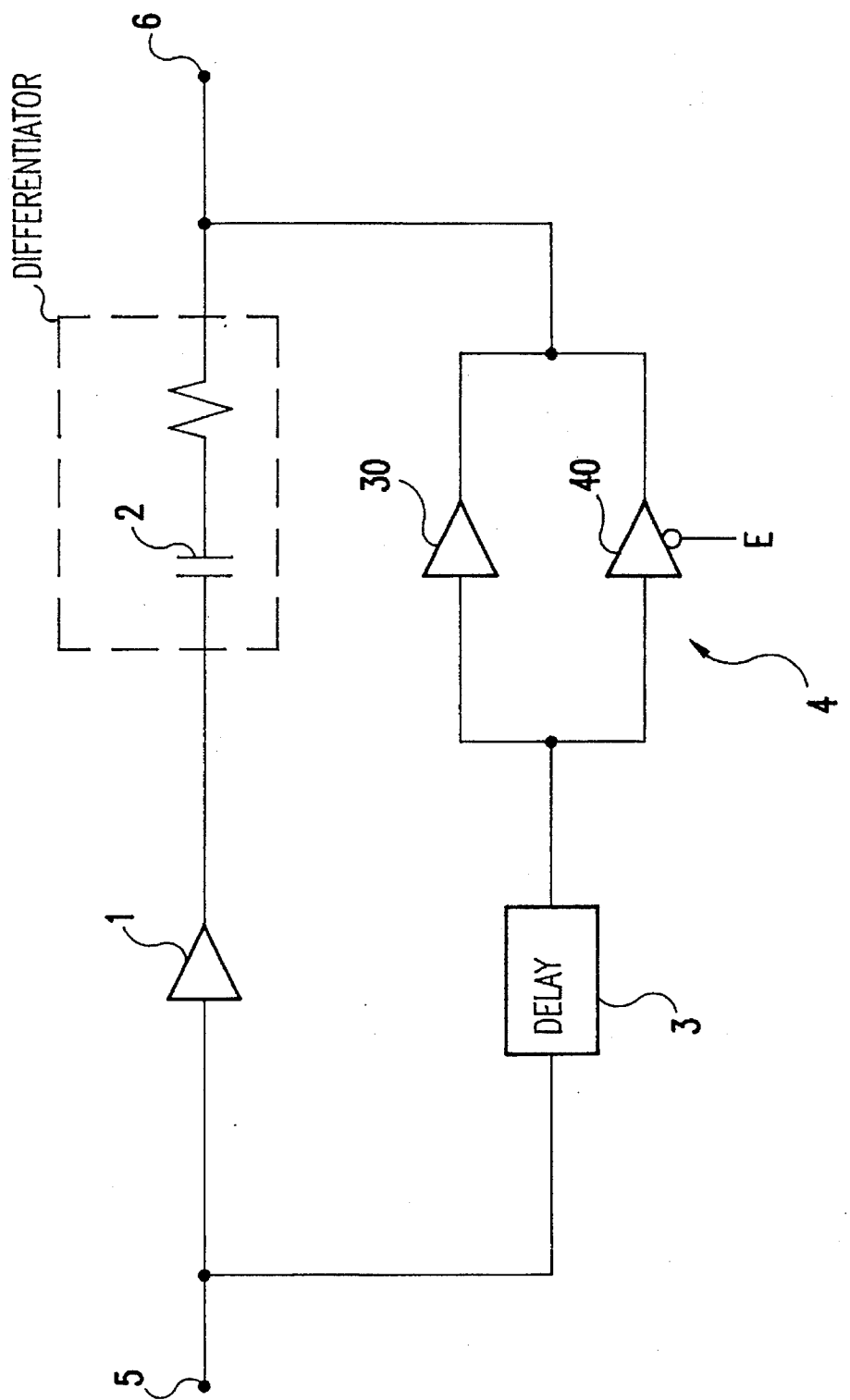
FIG. 7 is a circuit diagram of a bus driver according to the fourth embodiment of the present invention.

Referring to FIG. 7, the second buffer 4 includes a third buffer circuit 30 and a fourth buffer circuit 40 connected in parallel. The fourth buffer circuit 40 is enabled and disabled when an enable signal is set into states of "H" and "L", respectively. The enable signal is generated, for example, by a circuit external to the bus driver circuit. The second buffer circuit 4 has a greater power when the fourth buffer 40 is enabled than when it is disabled. Thus, the power of the second buffer circuit 4 is made adjustable.

Next is described the operation of the fourth embodiment referring to an exemplary operation. In this exemplary operation, the first, third and fourth buffer circuits 1, 30 and 40 have the same delay time of Tg. The delay time of the delay circuit 3 is Td.

Referring to FIG. 8(a), the input terminal 5 receives the same signal as that was depicted in FIG. 2(a). Receiving this input signal, the first buffer circuit 1 and the delay circuit 3 output the signals depicted in FIGS. 8(b) and 8(c) having delays of Tg and Td, respectively, as in the first embodiment.

Referring to FIG. 8(d), the capacitor 2 outputs the signal depicted in FIG. 8(d) as in the first embodiment.

Referring to FIG. 8(e), the third buffer circuit 30 outputs a signal having a delay of Td+Tg.

Referring to FIGS. 8(f) and 8(g), when the enable signal E is in the states of "H" and "L", the falling time of the output signal of the second buffer circuit 4 is Tf and Th, respectively. The time period Th is shorter than Tf. That is, the through-rate of output signal of the second buffer circuit 4 is selectively increased when the fourth buffer circuit 40 is enabled to increase the power of the second buffer circuit 4.

In the same way, when the enable signal E is in the states of "H" and "L", the rising time of the output signal of the second buffer circuit 4 is Tr and Ti, respectively. The time period Ti is shorter than Tr.

Referring to FIGS. 8(h) and 8(i), when the enable signal E is in the states of "H" and "L", output signals depicted in FIGS. 8(h) and 8(i) are produced, respectively, by combining the signals from the capacitor 2 and the second buffer circuit 4. Thus, the waveform of the output signal of the bus driver is selectively adjustable according to the enable signal E. While the logic states of the enable signal have been described above as "H" and "L", the logic states "L" and "H" obviously may be modified according to the designer's needs and objectives.

As stated above, according to the present invention, the output signal of the bus driver has reduced through-rates at edges of the signal to have rounded rising and falling edges. This waveform shaping reduces the noise in the signals through a bus such as reflection signals.

The waveform of the output signal is selectively adjustable by changing parameters of the parts included in the bus driver. Such parameters include the delay time of the delay circuit 3, the capacitance of the capacitor 2, the power of the buffer circuits 1 and 4.

When the waveform of the output signal deviates from that intended by the designer due to production errors, the waveform can be substantially matched to a desirable form by selectively adjusting the aforementioned parameters.

The present embodiments are therefore, to be considered in all respects as illustrative and not restrictive, the scope of the invention being indicated by the appended claims rather than by the foregoing description and all changes which come within the meanings and range of equivalency of the claims are therefore intended to the embraced therein.

What is claimed is:

1. A bus driver having an input terminal for receiving a signal and an output terminal for driving a bus, comprising:
    a first buffer circuit having input and output terminals, said input terminal of said first buffer circuit being connected to said input terminal of said bus driver;
    a differentiating circuit having input and output terminals, said input and output terminals of said differentiating circuit being connected to said output terminal of said first buffer circuit and said output terminal of said bus driver, respectively;
    a delay circuit having input and output terminals, said input terminal of said delay circuit being connected to said input terminal of said bus driver; and
    a second buffer circuit having input and output terminals, said input and output terminals of said second buffer circuit being connected to said output terminal of said delay circuit and said output terminal of said bus driver, respectively.

2. A bus driver according to claim 1, wherein said differentiating circuit comprises a capacitor and a resistor.

3. A bus driver according to claim 2, wherein said resistor comprises a resistance of said bus.

4. A bus driver according to claim 1, wherein said differentiating circuit includes means for selectively shaping first and second edges of an output signal of said bus driver.

5. A bus driver according to claim 4, wherein one of said first and second edges comprises a falling edge and the other of said first and second edges comprises a rising edge.

6. A bus driver according to claim 4, wherein said means for selectively shaping issues an output signal for rounding said first and second edges of said output signal of said bus driver.

7. A bus driver according to claim i, wherein said delay circuit includes means for selectively adjusting a delay time of said delay circuit, and said means for selectively adjusting adjusts a waveform of an output signal of said bus driver.

8. A bus driver according to claim 2, wherein said capacitor comprises means for adjusting a capacitance of said capacitor, and said means for adjusting selectively adjusts a waveform of an output signal of said bus driver.

9. A bus driver according to claim 1, wherein said second buffer circuit comprises means for adjusting a power of said second buffer circuit, and said means for adjusting selectively adjusts a waveform of an output signal of said bus driver.

10. A bus driver according to claim 9, wherein said second buffer circuit comprises third and fourth buffer circuits connected in parallel, said fourth buffer circuit for receiving an enable signal for activating said fourth buffer circuit.

11. A bus driver according to claim 1, wherein said delay circuit comprises a binary delay circuit having input and output terminals, said binary delay circuit comprises a selector receiving a selection signal and a delay element receiving an input signal at said input terminal of said binary delay circuit, and said selector outputs one of an output signal of said delay element and said input signal at said input terminal of said binary delay circuit according to said selection signal.

12. A bus driver according to claim 11, wherein said delay circuit comprises a plurality of said binary delay circuits having different delay times.

13. A bus driver according to claim 1, wherein said capacitor comprises a binary capacitor circuit having input and output terminals, said binary capacitor circuit includes a selector receiving a selection signal and a capacitance element receiving an input signal at said input terminal of said binary capacitor circuit, and said selector outputs one of an output signal of said capacitance element and said input signal at said input terminal of said binary capacitor circuit.

14. An integrated circuit comprising:
    a signal generating circuit;
    an output terminal operatively coupled to said signal generating circuit and to a bus; and
    a bus driver having input and output terminals connected to said signal generating circuit and said bus, respectively,
    wherein said bus driver comprises:
    a first buffer circuit having input and output terminals, said input terminal of said first buffer circuit being connected to said input terminal of said bus driver;
    a differentiating circuit having input and output terminals, said input and output terminals of said differentiating circuit being connected to said output terminal of said first buffer circuit and said output terminal of said bus driver, respectively;
    a delay circuit having input and output terminals, said input terminal of said delay circuit being connected to said input terminal of said bus driver; and
    a second buffer circuit having input and output terminals, said input and output terminals of said second buffer circuit being connected to said output terminal of said delay circuit and said output terminal of said bus driver, respectively.

15. An information processing apparatus, comprising:
    a bus;
    a signal generating circuit operatively coupled to said bus; and
    a bus driver having input and output terminals connected to said signal generating circuit and said bus, respectively,
    wherein said bus driver comprises:
    a first buffer circuit having input and output terminals, said input terminal of said first buffer circuit being connected to said input terminal of said bus driver;
    a differentiating circuit having input and output terminals, said input and output terminals of said differentiating circuit being connected to said output terminal of said first buffer circuit and said output terminal of said bus driver, respectively;

a delay circuit having input and output terminals, said input terminal of said delay circuit being connected to said input terminal of said bus driver; and a second buffer circuit having input and output terminals, said input and output terminals of said second buffer circuit being connected to said output terminal of said delay circuit and said output terminal of said bus driver, respectively.

\* \* \* \* \*